(12) United States Patent
Hu et al.

(10) Patent No.: US 8,905,362 B2
(45) Date of Patent: Dec. 9, 2014

(54) TEST SUPPORT APPARATUS

(75) Inventors: Cong-Xu Hu, Wuhan (CN); Yu-Lan Liu, Wuhan (CN); Yong Ma, Wuhan (CN); Yu-Lin Liu, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 74 days.

(21) Appl. No.: 13/565,780

(22) Filed: Aug. 2, 2012

(65) Prior Publication Data

US 2013/0153732 A1 Jun. 20, 2013

(30) Foreign Application Priority Data

Dec. 20, 2011 (CN) .......................... 2011 1 0429315

(51) Int. Cl.
*F16M 11/06* (2006.01)
(52) U.S. Cl.
USPC ................... 248/185.1; 248/346.06; 269/903
(58) Field of Classification Search
CPC ........ A47B 97/08; A47B 23/06; A47B 19/06; A47B 23/042; A47B 23/043; A47B 27/02; A47B 97/02; A47B 5/12; F16M 11/10
USPC ........... 248/447, 452, 454, 122.1, 371, 185.1, 248/346.03, 346.06, 510; 269/903
See application file for complete search history.

(56) References Cited

U.S. PATENT DOCUMENTS

| | | | | | |
|---|---|---|---|---|---|
| 1,571,131 | A | * | 1/1926 | McIntosh | 248/456 |
| 1,767,950 | A | * | 6/1930 | Westbrook | 248/454 |
| 1,797,889 | A | * | 3/1931 | Wiberg | 248/454 |
| 3,095,665 | A | * | 7/1963 | Killen | 248/449 |
| 3,799,488 | A | * | 3/1974 | Sena | 248/452 |
| 4,702,453 | A | * | 10/1987 | Bishop | 248/447.2 |
| 4,753,408 | A | * | 6/1988 | Wailes | 248/371 |
| 5,145,141 | A | * | 9/1992 | Hunter | 248/452 |
| 5,167,405 | A | * | 12/1992 | Cayley, Jr. | 269/309 |
| 5,655,651 | A | * | 8/1997 | Maier | 206/1.7 |
| 6,000,663 | A | * | 12/1999 | Plasse et al. | 248/27.8 |
| 2009/0314917 | A1 | * | 12/2009 | Edgmon et al. | 248/452 |
| 2013/0133443 | A1 | * | 5/2013 | Qin et al. | 73/864.91 |
| 2013/0153729 | A1 | * | 6/2013 | Hu et al. | 248/316.5 |

* cited by examiner

*Primary Examiner* — Bradley Duckworth
(74) *Attorney, Agent, or Firm* — Novak Druce Connolly Bove + Quigg LLP

(57) ABSTRACT

A test support apparatus includes a base, a support bracket, a first positioning member mounted to the support bracket; and a positioning arm. The support bracket is pivotally mounted to the base and keeps an angle relative to the base. The support bracket supports a product. The positioning arm defines an elongated positioning slot. The positioning arm is mounted to the base. The first positioning member is positioned in different positions of the elongated positioning slot to change the angle.

14 Claims, 4 Drawing Sheets

TEST SUPPORT APPARATUS

BACKGROUND

1. Technical Field

The present disclosure relates to a test support apparatus.

2. Description of Related Art

Products, such as expansion cards, often need to go through various tests. When the expansion card is tested, the expansion card is mounted to a test support apparatus. The testing support apparatus cannot be adjusted to change the position of the expansion card.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
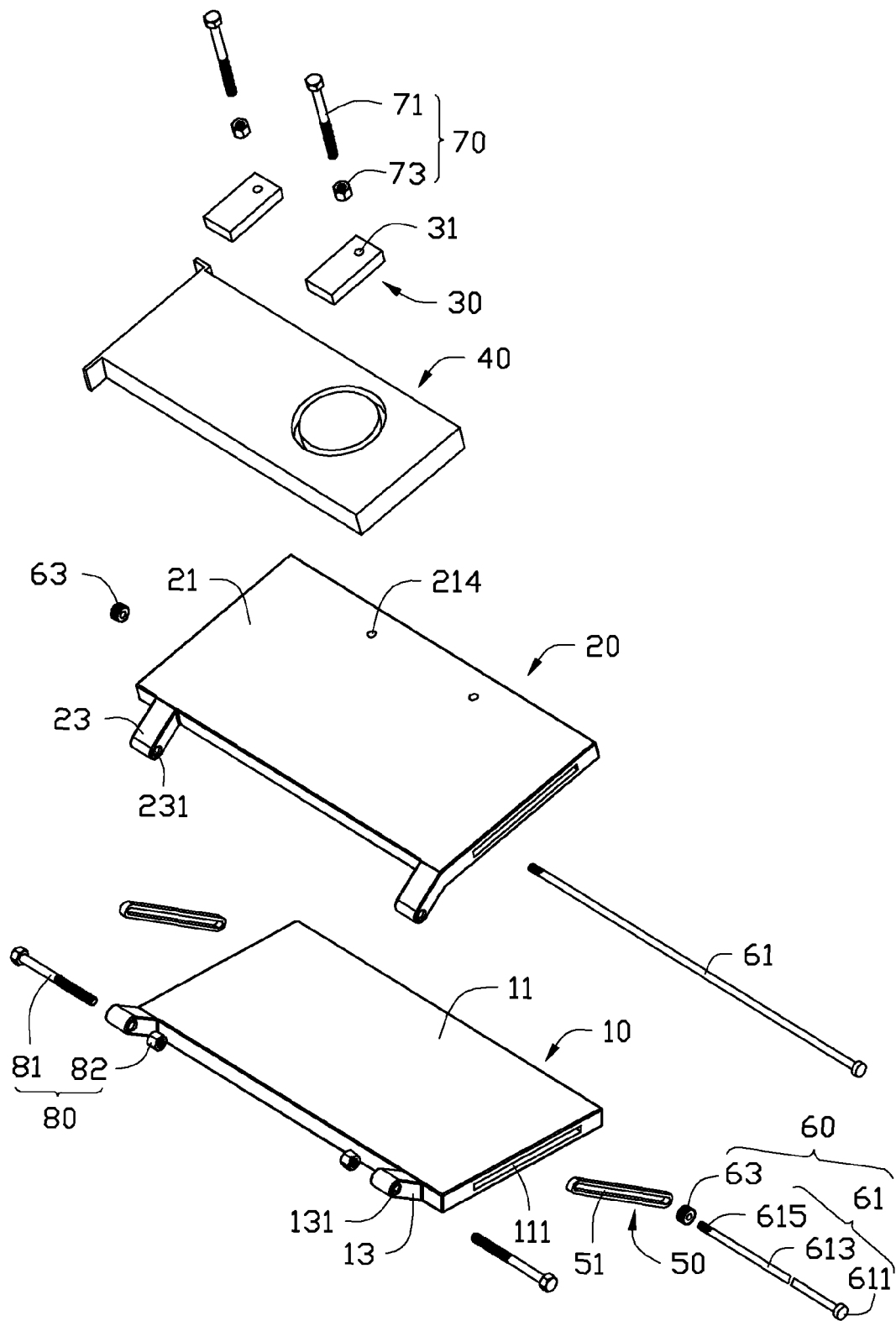
FIG. 1 is an exploded, isometric view of a test support apparatus and a product in accordance with an embodiment.
Figure 2:
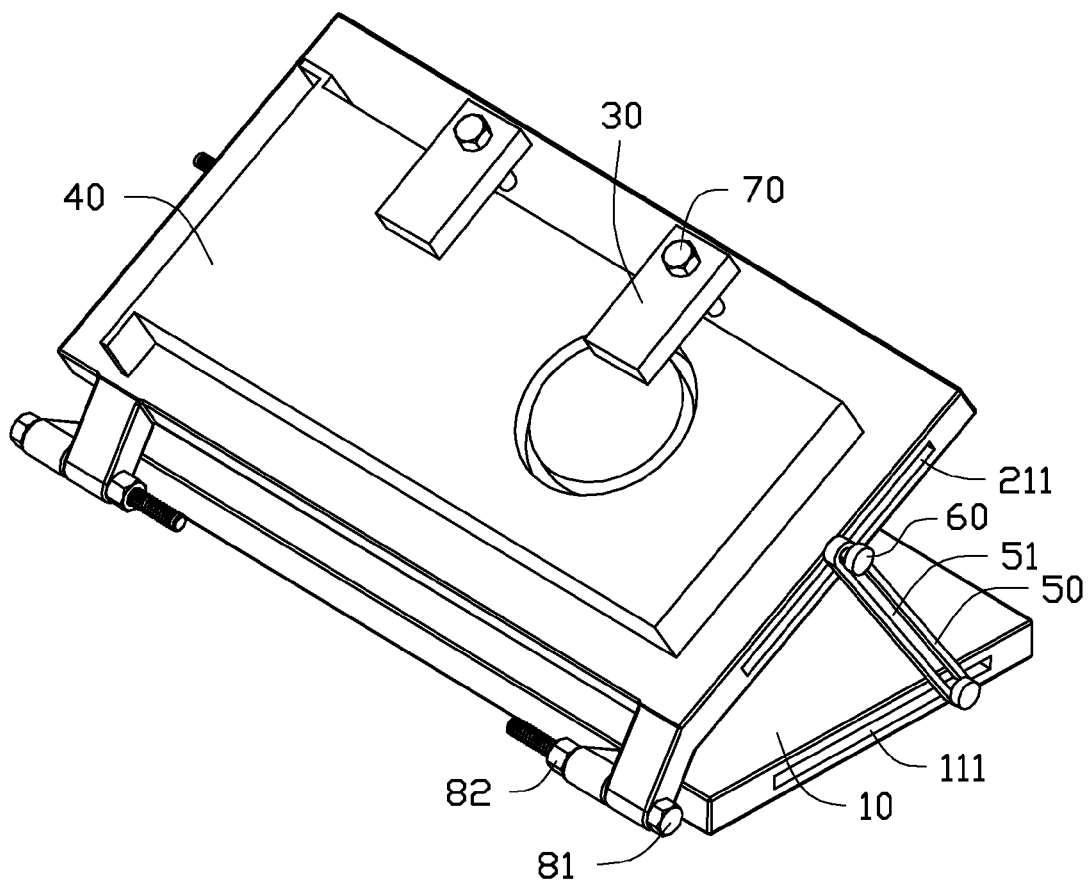
FIG. 2 is an assembled view of FIG. 1.

Referring to FIGS. 1 and 2, a test support apparatus in accordance with an embodiment is shown. The test support apparatus includes a base 10, a support bracket 20 pivotally mounted to the base 10, two securing clamps 30 secured to the support bracket 20, two positioning arms 50, and two positioning members 60. In one embodiment, the test support apparatus is used fro clamping an expansion card 40.

The base 10 includes a base body 11 and two first pivot portions 13 extending from one side of the base body 11. Each first pivot portion 13 defines a first pivot hole 131 in the free end of the first pivot portion 13. In one embodiment, the base body 11 is rectangular. There is an obtuse angle between each first pivot portion 13 and the base body 11. The base body 11 defines a first elongated sliding slot 111 passing through the base body 11.

The support bracket 20 includes a support panel 21 and two second pivot portions 23 extending from one side of the support panel 21. In one embodiment, the support panel 21 is rectangular. There is an obtuse angle between each second pivot portion 23 and the support panel 21. The support panel 21 defines two positioning holes 214. Each second pivot portion 23 defines a second pivot hole 231 corresponding to the first pivot hole 131. The support panel 21 defines a second elongated sliding slot 211 passing through the support panel 21. Each clamp 30 defines a securing hole 31 corresponding to the positioning hole 214.

Two securing members 70 are used for securing the two clamps 30 to the support panel 21. Each securing member 70 includes a securing shaft 71 and a securing nut 73. The securing shaft 71 defines outer screws. The securing nut 73 defines inner screws for engaging the outer screws of the securing shaft 71. Each positioning arm 50 defines an elongated positioning slot 51.

Each positioning member 60 includes a positioning shaft 61 and a positioning nut 63. The positioning shaft 61 includes a head portion 611, a shaft portion 613 extending from the head portion 611, and a securing portion 615 extending from the shaft portion 613. The securing portion 615 defines outer screws. The positioning nut 63 defines inner screws for engaging the outer screws of the positioning shaft 61.

Referring to FIG. 2, in assembly, the support bracket 20 is placed on the base 10 to enable the second pivot hole 231 to be aligned with the first pivot hole 131. A pivot shaft 81 of a pivot member 80 passes through the second pivot hole 231 and the first pivot hole 131. A pivot nut 82 of the pivot member 80 is screwed to the pivot shaft 81 to pivotally attach the second pivot portion 23 to the first pivot portion 13.

The positioning slot 51 of each positioning arm 50 is aligned with the first elongated sliding slot 111 of the base body 11 and the second elongated sliding slot 211 of the support panel 21. The two positioning shafts 61 pass through the positioning slot 51 of one positioning arm 50, the first elongated sliding slot 111, and the second elongated sliding slot 211, and then pass through the positioning slot 51 of the other positioning arm 50. The two positioning nuts 63 are screwed to the two securing portions 615 of the two positioning shafts 61, thereby securing the support bracket 20 to the base 10. There is an angle defined between the support panel 21 and the base 10.

The two clamps 30 are placed on the support bracket 20 to enable the securing holes 31 of the clamps 30 to be aligned with the positioning holes 214 of the support panel 21. The securing shafts 71 of the two securing members 70 pass through the securing holes 31 and the corresponding positioning holes 214. The securing nuts 73 are screwed to the securing shaft 71 to enable the two clamps 30 to be movably attached to the support panel 21.

The securing nuts 73 are rotated along a first rotation direction to adjust the distance between the clamps 30 and the support panel 21 to receive the expansion card 40. The securing nuts 73 are rotated along a second rotation direction substantially opposite to the first rotation direction to adjust the clamps 30 to resist the expansion card 40. At this time, the expansion card 40 is sandwiched between the two clamps 30 and the support panel 21.

Figure 3:
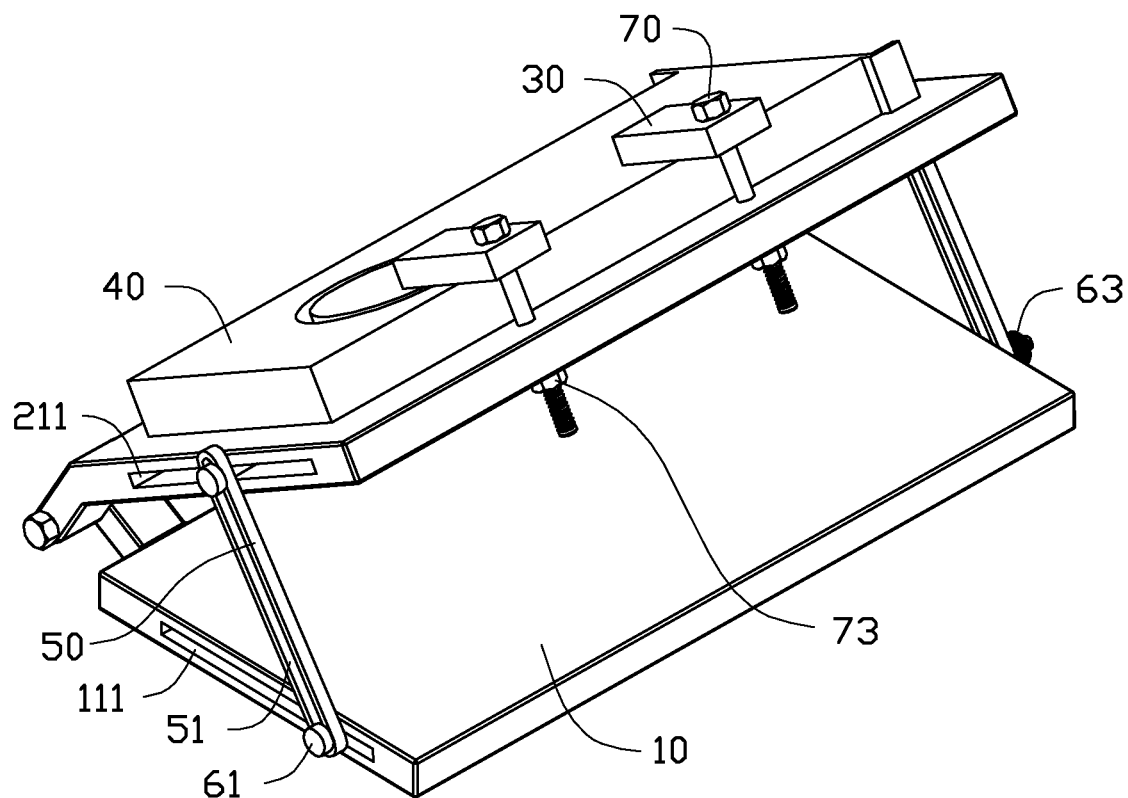
FIG. 3 is similar to FIG. 2, but viewed from another aspect.
Figure 4:
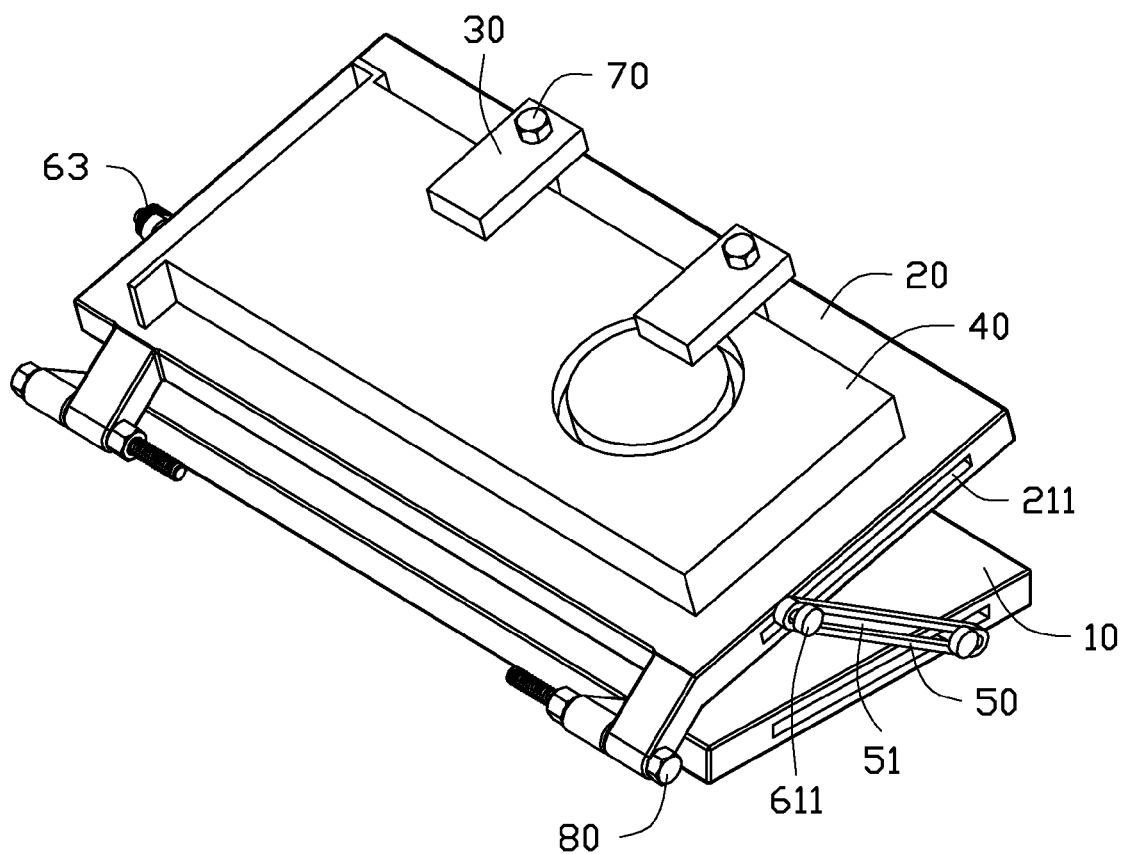
FIG. 4 is an assembled view of FIG. 1, the test support apparatus in an adjusting status.

Referring to FIGS. 3 and 4, when the angle between the support panel 21 and the base 10, needs to be adjusted, the positioning nuts 63 are rotated along a third rotation direction to enable the positioning shaft 61 to move in the first elongated sliding slot 111, in the second elongated sliding slot 211, or in the positioning slot 51. Then the positioning nuts 63 are rotated along a fourth rotation direction substantially opposite to the third rotation direction to secure the positioning shaft 61 tightly, thereby changing the angle between the support panel 21 and the base 10.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A test support apparatus comprising:
a base;
a support bracket pivotally mounted to the base and keeping an angle relative to the base, the support bracket is configured to support a product;
a first positioning member mounted to the support bracket; and
a positioning arm, the positioning arm defines an elongated positioning slot, and the positioning arm is mounted to the base;
wherein the base comprises a first pivot portion; the support bracket comprises a second pivot portion; the first pivot portion is pivotably mounted to the second pivot portion via a pivot member; the base comprises a base body; the first pivot portion extends from the base body; a first obtuse angle is defined between the first pivot portion and the base body; and the first positioning member is configured to be positioned in different positions of the elongated positioning slot to change the angle.

2. The test support apparatus of claim 1, wherein the support bracket defines an elongated sliding slot; the first positioning member is positioned in the elongated sliding slot; and the first positioning member is configured to be positioned in different positions of the elongated sliding slot to change the angle.

3. The test support apparatus of claim 1, further comprising a second positioning member, wherein the base defines an elongated sliding slot; the second positioning member is mounted to the positioning arm and is positioned in the elongated sliding slot; and the second positioning member is configured to be positioned in different positions of the elongated sliding slot to change the angle.

4. The test support apparatus of claim 3, wherein the second positioning member is positioned in the elongated positioning slot to secure the positioning arm to the base.

5. The test support apparatus of claim 1, wherein the first positioning member comprises a positioning shaft and a positioning nut; the positioning shaft is received in the elongated positioning slot; and the positioning nut is screwed to the positioning shaft.

6. The test support apparatus of claim 1, further comprising a securing clamp, wherein the securing clamp is mounted to the support bracket via a securing member, and the securing clamp is configured to adjust a distance between the securing clamp and the support bracket to sandwich the product therebetween.

7. The test support apparatus of claim 1, wherein the support bracket comprises a support panel; the second pivot portion extends from the support panel; a second obtuse angle is defined between the second pivot portion and the support panel.

8. A test support apparatus comprising:
a base;
a support bracket pivotally mounted to the base; the support bracket is configured to support a product;
a first positioning member mounted to the support bracket;
a second positioning member mounted to the base;
a positioning arm, the positioning arm defines an elongated positioning slot,
wherein the base comprises a first pivot portion; the support bracket comprises a second pivot portion; the first pivot portion is pivotably mounted to the second pivot portion via a pivot member; the base comprises a base body; the first pivot portion extends from the base body; and a first obtuse angle is defined between the first pivot portion and the base body; the first positioning member and the second positioning member are positioned in the elongated positioning slot to enable the support bracket to maintain an angle relative to the base; the first positioning member is configured to be positioned in different positions of the elongated positioning slot to change the angle; and the second positioning member is configured to be positioned in different positions of the elongated positioning slot to change the angle.

9. The test support apparatus of claim 8, wherein the support bracket defines an elongated sliding slot; the first positioning member is positioned in the elongated sliding slot; and the first positioning member is configured to be positioned in different positions of the elongated sliding slot to change the angle.

10. The test support apparatus of claim 8, wherein the base defines an elongated sliding slot; the second positioning member is mounted to the positioning arm and is positioned in the elongated sliding slot; and the second positioning member is configured to be positioned in different positions of the elongated sliding slot to change the angle.

11. The test support apparatus of claim 10, wherein the second positioning member is positioned in the elongated positioning slot to secure the positioning arm to the base.

12. The test support apparatus of claim 8, wherein the first positioning member comprises a positioning shaft and a positioning nut; the positioning shaft is received in the elongated positioning slot; and the positioning nut is screwed to the positioning shaft.

13. The test support apparatus of claim 8, further comprising a securing clamp, wherein the securing clamp is mounted to the support bracket via a securing member, and the securing clamp is configured to adjust a distance between the securing clamp and the support bracket to sandwich the product therebetween.

14. The test support apparatus of claim 8, wherein the support bracket comprises a support panel; the second pivot portion extends from the support panel; and a second obtuse angle is defined between the second pivot portion and the support panel.

* * * * *